United States Patent
Beuchert et al.

(10) Patent No.: US 11,761,980 B2
(45) Date of Patent: Sep. 19, 2023

(54) APPARATUS AND METHOD FOR ADJUSTING CALIBRATION PARAMETERS AND SENSOR SYSTEM

(71) Applicant: Robert Bosch GmbH, Stuttgart (DE)

(72) Inventors: Hanna Beuchert, Reutlingen (DE); Juergen Gut, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/648,521

(22) Filed: Jan. 20, 2022

(65) Prior Publication Data
US 2022/0236300 A1 Jul. 28, 2022

(30) Foreign Application Priority Data
Jan. 28, 2021 (DE) ................... 10 2021 200 763.5

(51) Int. Cl.
*G01P 21/00* (2006.01)
*B81B 7/00* (2006.01)

(52) U.S. Cl.
CPC .............. *G01P 21/00* (2013.01); *B81B 7/008* (2013.01); *B81B 2201/0235* (2013.01)

(58) Field of Classification Search
CPC ....................................................... G01P 21/00
See application file for complete search history.

(56) References Cited

U.S. PATENT DOCUMENTS

| | | | |
|---|---|---|---|
| 2014/0343885 A1* | 11/2014 | Abrahamsson | G01C 22/006 702/96 |
| 2017/0343349 A1 | 11/2017 | Han et al. | |
| 2020/0300929 A1 | 9/2020 | Omura et al. | |

FOREIGN PATENT DOCUMENTS

DE 102010029668 A1 12/2011

\* cited by examiner

*Primary Examiner* — Walter L Lindsay, Jr.
*Assistant Examiner* — Andrew V Do
(74) *Attorney, Agent, or Firm* — NORTON ROSE FULBRIGHT US LLP; Gerard Messina

(57) ABSTRACT

Adjusting of calibration parameters for a sensor. The adjusted calibration parameters may be used to correct the raw data of the sensor. It is provided to calculate new calibration parameters only when accuracy of the calibration parameters currently available is no longer adequate, and suitable measurement data are available for a recalibration of the sensor. Otherwise, the components necessary for calibrating the sensor data may be deactivated in order to reduce energy consumption.

15 Claims, 4 Drawing Sheets

APPARATUS AND METHOD FOR ADJUSTING CALIBRATION PARAMETERS AND SENSOR SYSTEM

CROSS REFERENCE

The present application claims the benefit under 35 U.S.C. § 119 of German Patent Application No. DE 10 2021 200 763.5 filed on Jan. 28, 2021, which is expressly incorporated herein by reference in its entirety.

FIELD

The present invention relates to an apparatus for adjusting calibration parameters, as well as a sensor system having such an apparatus. The present invention also relates to a method for adjusting calibration parameters. In particular, the present invention relates to the adjusting of calibration parameters for sensor data.

BACKGROUND INFORMATION

Sensors, particularly sensors having a micro-electro-mechanical system (MEMS), are employed in numerous fields of application. For example, MEMS sensors are used in portable electronic devices such as smart phones, hearables and wearables. In that case, the sensors may be used, e.g., to sense an acceleration, a yaw rate or a magnetic field in order to determine the orientation of the device in space. To compensate for manufacturing-induced systematic measuring errors such as offsets, a pre-calibration may already be carried out during production, for example. In addition, in order to take temperature-caused fluctuations or aging effects of the sensor into account, the sensor may be recalibrated during operation.

For example, German Patent Application No. DE 10 2010 029 668 A1 describes a method for calibrating a triaxial magnetic-field sensor. To that end, it is proposed to first of all determine an offset of recorded measured values of the magnetic-field sensor by a superimposed signal and subsequently to ascertain the sensitivity of the magnetic-field sensor along the measuring axes. The sensitivity is ascertained by first determining the sensitivity along a first measuring axis, and then determining the sensitivity of the magnetic-field sensor along the other measuring axes on the basis of the sensitivity of the first measuring axis.

SUMMARY

The present invention provides an apparatus and a method for adjusting calibration parameters for a sensor, as well as a sensor system. Further advantageous specific embodiments of the present invention are disclosed herein.

Provided in accordance with an example embodiment of the present invention is:

An apparatus for adjusting calibration parameters for a sensor having a control device and a calibrator. The control device includes a storage device, a monitoring module, a control module and a measurement-data evaluation module. The storage device is designed to store a set of calibration parameters for the sensor. The monitoring module is designed to ascertain at least one accuracy value of the calibration parameters stored in the storage device. The accuracy value is ascertained when the sensor is in a predetermined state. The control module is designed to compare the at least one ascertained accuracy value of the calibration parameters to a predetermined accuracy criterion. The measurement-data evaluation module is designed to receive measurement data from the sensor. In addition, the measurement-data evaluation module is designed to check whether the measurement data received are suitable for calculating calibration parameters. The calibrator is designed to calculate a new set of calibration parameters. In particular, the new set of calibration parameters is calculated by the calibrator, utilizing the measurement data received by the measurement-data evaluation module. A new set of calibration parameters is calculated if the at least one ascertained accuracy value of the calibration parameters stored in the storage device does not satisfy the accuracy criterion, and the measurement data received are suitable for determining a new set of calibration parameters.

Also provided in accordance with an example embodiment of the present invention is:

A sensor system having a sensor, an apparatus according to the present invention for adjusting calibration parameters, and a compensating device. The sensor is designed to output measurement data which correspond to a measured variable monitored by the sensor. The compensating device is designed to correct the measurement data output by the sensor, utilizing calibration parameters.

Provided in accordance with an example embodiment of the present invention is:

A method for adjusting calibration parameters for a sensor. The method includes a step of monitoring whether the sensor is in a predetermined state. In addition, the method includes a step of ascertaining at least one accuracy value of a current set of calibration parameters for the sensor. The method also includes a step of comparing the at least one ascertained accuracy value of the current set of calibration parameters to a predetermined accuracy criterion. Moreover, the method includes a step of checking whether the measurement data provided by the sensor are suitable for calculating calibration parameters. Finally, the method includes a step of calculating a new set of calibration parameters. In particular, the new set of calibration parameters is calculated utilizing the measurement data received. The new set of calibration parameters is calculated if the at least one ascertained accuracy value of the current set of calibration parameters does not satisfy the predetermined accuracy criterion, and the measurement data received are suitable for calculating a new set of calibration parameters.

Example embodiments of the present invention are based on the recognition that it may be necessary to adjust the calibration of data of a sensor in the course of its service life, and particularly in response to changing boundary conditions such as temperature fluctuations, for example. Example embodiments of the present invention are also based on the knowledge that the ascertainment of new calibration parameters is associated with additional computational effort and thus a higher energy consumption of the sensor system, as well.

One object of the present invention is to provide as efficient and energy-saving an approach as possible for determining calibration parameters for a sensor system. To that end, it is provided in accordance with an example embodiment of the present invention to check the existing calibration parameters for their actual accuracy and to determine a set of new calibration parameters only if, on one hand, the accuracy with the existing calibration parameters no longer satisfies the specified standards and, in addition, suitable measurement data are also provided by the sensor system, which make it possible to determine a new set of calibration parameters. Otherwise, components of the sensor system which are necessary for determining new calibration parameters may be deactivated. In this way, sufficiently high accuracy of the calibrated sensor data may be attained on one hand, while on the other hand, the energy consumption of the sensor system is able to be minimized.

The sensors whose data may be calibrated in this manner may be any suitable sensors. In particular, the sensors may be sensors having a micro-electro-mechanical system (MEMS). As an example, the sensors may be sensors which are utilized in portable devices such as smart phones, hearables or wearables. For instance, the sensors may be MEMS sensors which are used to sense an acceleration, a yaw rate or a magnetic field. A position, movement and/or orientation in space may be ascertained using such sensors, for example.

In general, the calibration parameters used may be any calibration parameters which are suitable for correcting the raw data provided by a sensor. For example, the calibration parameters may specify an offset or a scaling factor of the raw data provided by the sensor. In addition, the calibration parameters may also specify any other properties in the raw data provided by the sensor, which are able to be corrected or compensated utilizing the calibration parameters. Accordingly, the term "set of calibration parameters" may be understood to mean both a single parameter which specifies, e.g., an offset or the like, as well as any higher number of parameters which, for example, characterize linear or non-linear properties of the raw data provided by the sensor.

To evaluate an accuracy for the current calibration parameters, a predetermined state of the sensor or sensor system may be identified, for example, and in this state, the resulting sensor data, especially the raw data and/or the calibrated sensor data, may be evaluated. To that end, for example, the data may be compared to predetermined expected values or the like. For instance, if a motion sensor delivers a value other than zero, even though it is known or at least assumed that the system having this sensor is at a standstill, then a deviation may be inferred from this. Based on this identified deviation, for example, a recalibration, i.e., determination of a new set of calibration parameters may be initiated. The accuracy values of other sensors, e.g., magnetic-field sensors, yaw-rate sensors or the like, may also be evaluated in analogous manner. Depending on the kind or type of sensor, the accuracy of calibration parameters may be evaluated, e.g., in a state of rest of the sensor system, in a predetermined, especially constant position of the sensor system in space or in another suitable state.

As explained in greater detail below, in particular a temperature of the sensor or sensor system and/or temperature changes may also be taken into account in the evaluation of the calibration parameters and possibly also in the adjustment of the calibration parameters.

If it is determined that the current calibration parameters do not satisfy the desired accuracy standards, then determination of new calibration parameters may be initiated. To do this, however, it is also necessary that suitable data, especially suitable sensor data, be available for such a re-determination of calibration parameters, as well. For this purpose, the data provided by the sensor may be checked with respect to their suitability for determining new calibration parameters. For example, it may be checked whether the sensor or the sensor system is in a state suitable for determining new calibration parameters. For instance, it may be checked whether the sensor or the sensor system is at a standstill, in a predetermined position, location or the like. To ascertain calibration parameters for a motion sensor, for example, it may be checked whether the sensor or the sensor system is at a standstill. In this case, a possible offset of the data supplied by the sensor may be identified, and the calibration parameters may be adjusted accordingly. Analogously for a magnetic-field sensor, a yaw-rate sensor or the like, as well, in each case it may first be checked whether the sensor or the sensor system is in a state, such as a known position or location, suitable for determining new calibration parameters.

In addition, a present temperature and/or a temperature development in or at the sensor and/or the sensor system may also be taken into account in order to decide whether or not a determination of new calibration parameters should be initiated. For example, new calibration parameters may be determined only when a constant or at least approximately constant temperature has set in at the sensor or sensor system. Likewise, it is possible to initiate a determination of new calibration parameters only when the sensor or the sensor system is in a predetermined temperature range.

The components, especially the calibrator, necessary for determining new calibration parameters may be activated, for example, only when a new determination of calibration parameters is actually to be carried out. Otherwise, these components, especially the calibrator, may be deactivated. For example, the calibrator may be transferred into a standby mode and activated only when it is actually necessary to determine new calibration parameters. Alternatively, the calibrator may also be completely switched off so long as no new determination of calibration parameters is necessary. In this way, the energy consumption of the overall system may be reduced. This has an especially beneficial effect particularly in the case of portable systems, which are powered by an electrical energy store such as a battery or the like.

According to one specific embodiment of the present invention, the control device is designed to activate the calibrator when the at least one ascertained accuracy value of the calibration parameters stored in the storage device does not satisfy the accuracy criterion, and the measurement data received are suitable for determining a new set of calibration parameters. If the calibrator is activated only depending on the condition indicated, then the length of time in which the calibrator is actively operating may be curtailed.

According to one specific embodiment of the present invention, the control device is designed to deactivate the calibrator after the calibrator has finished calculating a new set of calibration parameters. For example, the deactivation of the calibrator may include a complete shutdown of the calibrator. Alternatively, the calibrator may also be transferred into a standby mode in which the energy consumption of the calibrator is significantly lower. After the calibrator has calculated a new set of calibration parameters, the calibrator may then be deactivated again. In this way, the active time of the calibrator is minimized, and thus the energy consumption of the system is also minimized accordingly. The energy consumption of the overall system may thereby be minimized.

According to one specific embodiment of the present invention, the control device is designed to activate the calibrator when a predetermined period of time has elapsed since the last calculation of a new set of calibration parameters. For example, a new calculation of calibration parameters may be carried out periodically with a preset period duration, or calibration parameters may be calculated at previously fixed points in time. Alternatively, it is also possible after each new calculation of calibration parameters, to prevent a new calculation of further calibration parameters for at least a predetermined period of time. In this way, it is possible to prevent new calibration parameters from being calculated too frequently, and the energy consumption of the system may thus be further reduced.

According to one specific embodiment of the present invention, the control device is designed to modify setting parameters of the calibrator. For example, these setting parameters of the calibrator may influence a weighting of measured values. In particular, the setting parameters of the calibrator may include filter parameters or the like. Naturally, any other suitable setting parameters of the calibrator, which may be adjusted by the control device, are also possible. For instance, the setting parameters may be adjusted based on the measurement data provided presently by the sensor, and/or further parameters such as a temperature of the sensor or the sensor system or the like. In addition, for example, a present evaluation of the accuracy, e.g., the accuracy of the current calibration parameters ascertained by the monitoring module, may also be taken into consideration, in order to adjust the setting parameters of the calibrator appropriately.

According to one specific embodiment of the present invention, the control device includes a temperature-evaluation module. The temperature-evaluation module may be designed to determine and possibly to store a present temperature of the sensor. In this case, the control device may be designed to activate the calibrator when the present ascertained temperature of the sensor deviates from a preset reference temperature value by more than a predetermined setpoint value. In particular, the reference temperature value may be determined from one or more previous stored temperature measurement values. Temperature fluctuations may have a relatively great influence on the raw data provided by the sensor. Accordingly, in response to a temperature change, it may be necessary to adjust the calibration parameters for the sensor. For instance, if a portable device is moved and is thereby brought into an environment with a different ambient temperature, then the temperature of the sensor may change, as well. This may possibly make it necessary to adjust the calibration parameters. For example, it may be necessary to adjust the calibration parameters if a device such as a smart phone or the like is brought from the inside of a building to the outside, or conversely, from the outside to the inside.

According to one specific embodiment of the present invention, the apparatus for adjusting the calibration parameters includes a temperature-modeling device having a model-data memory and a prediction module. The prediction model may be designed to provide temperature-dependent calibration parameters, utilizing a present temperature and a temperature model stored in the model-data memory. Accordingly, utilizing such model data, an adjustment of the calibration parameters may be implemented, which make it possible to provide temperature-dependent calibration parameters, without new calibration parameters having to be calculated immediately in response to every change in temperature.

According to one specific embodiment of the present invention, the temperature-modeling device includes a module for estimating a temperature model. This module for estimating the temperature model may be designed to calculate a temperature-dependent model for calibration parameters. In addition, the module for estimating the temperature model may be designed to store the data of the calculated temperature model in the model-data memory of the temperature-modeling device. In this way, a modeling of the temperature dependency of the calibration parameters for the sensor is possible within the apparatus for adjusting the calibration parameters. This permits a dynamic adjustment of the modeling.

According to one specific embodiment of the present invention, the measurement-data evaluation module is designed to classify the measurement data as suitable for calculating calibration parameters, when the sensor is in a predetermined state. For example, such a predetermined state may include a known or predetermined location of the sensor or sensor system in space. Additionally or alternatively, for example, the predetermined state may include a predetermined movement, e.g., a linear movement with a predetermined speed or a speed of zero, that is, standstill. In addition, for instance, the predetermined state may also include at least one predetermined spatial orientation in relation to at least one direction in space. Depending on the sensor, of course, any other suitable predetermined states may also be provided as suitable for a corresponding classification.

According to one specific embodiment of the present invention, the measurement-data evaluation module is designed to classify only those measurement data as suitable for calculating calibration parameters which differ from measurement data that were taken as a basis for a previous calculation step of calibration parameters. If no new measurement data are present which differ from the measurement data of a previous calculation step, then the recalculation of the calibration parameters may be paused until new measurement data are available again. As a result, the extra work of the calibration process and thus the energy consumption may also be reduced.

According to one specific embodiment of the present invention, the apparatus for adjusting calibration parameters includes an input interface via which the control device and/or the calibrator is/are able to be selectively activated and deactivated totally or in part. An external activation and/or deactivation of a calculation of new calibration parameters is thus possible, as well.

As explained above, the sensor data may be sensor data which were provided by any suitable sensor. In particular, the sensor system having an apparatus of the present invention for adjusting calibration parameters may include a sensor having a micro-electro-mechanical system. For example, the sensor may be an acceleration sensor, a yaw-rate sensor and/or a magnetic-field sensor.

The example embodiments and further developments above may be combined with each other in any way desired, in so far as reasonable. Additional embodiments, further developments and implementations of the present invention also include combinations, not explicitly named, of features of the present invention described above or in the following with respect to the exemplary embodiments. In particular, one skilled in the art will also add individual aspects as improvements of or additions to the respective basic forms of the present invention, in view of the disclosure herein.

BRIEF DESCRIPTION OF THE DRAWINGS

Further features and advantages of the present invention are explained hereinafter with reference to the figures.

DETAILED DESCRIPTION OF EXAMPLE EMBODIMENTS

Figure 1:
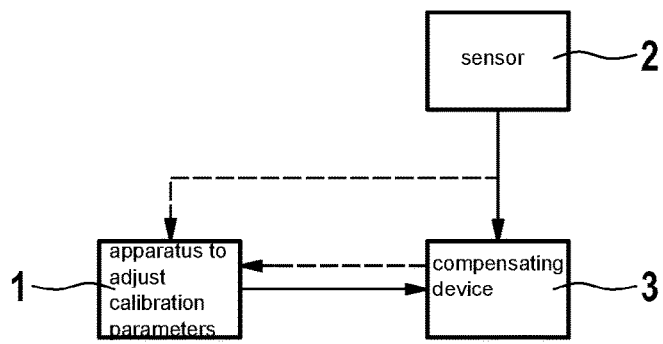
FIG. 1 shows a schematic representation of a block diagram of a sensor system having an apparatus for adjusting calibration parameters according to one specific embodiment of the present invention.

FIG. 1 shows a schematic representation of a block diagram of a sensor system according to one specific embodiment. The sensor system includes a sensor 2, which is able to provide measurement data that correspond to a measured variable monitored by the sensor. As an example, sensor 2 may be a sensor having a micro-electro-mechanical system (MEMS). For instance, the sensor may be an acceleration sensor, a yaw-rate sensor or a magnetic-field sensor. Naturally, any other suitable sensors are possible, as well.

The raw data made available by sensor 2 may be provided to a compensating device 3. Utilizing calibration parameters, this compensating device 3 is able to correct the measurement data output by the sensor, and output compensated sensor data. For example, the compensating device may correct an offset of the raw sensor data. In addition, non-linearities or the like may also be corrected, for instance, utilizing suitable calibration parameters. In particular, a temperature-dependent correction of the raw sensor data is possible, as well.

For the correction of the raw sensor data by compensating device 3, suitable calibration parameters may be provided to the compensating device. For example, this may be carried out by an apparatus 1 for adjusting calibration parameters. As to that, apparatus 1 for adjusting calibration parameters is explained in greater detail in the following.

Figure 2:
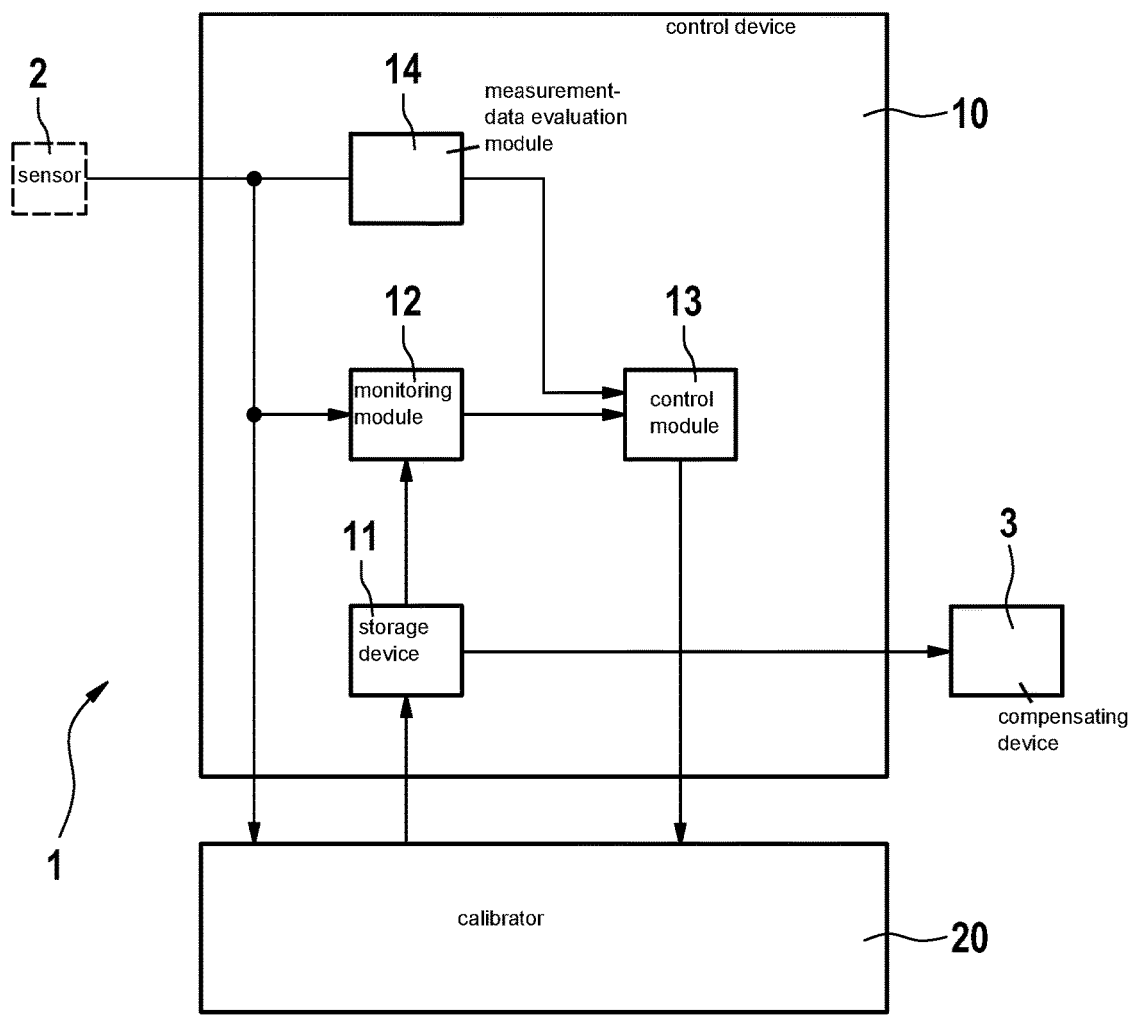
FIG. 2 shows a schematic representation of a block diagram of an apparatus for adjusting calibration parameters according to one specific embodiment of the present invention.

FIG. 2 shows a schematic representation of a block diagram of an apparatus 1 for adjusting calibration parameters. Apparatus 1 for adjusting calibration parameters includes at least one control device 10 and a calibrator 20. In this case, control device 10 monitors the accuracy of the calibration parameters currently being used and, if necessary, initiates a calculation of new calibration parameters by calibrator 20. In addition, control device 10 may check the data provided by a sensor 2, and if a calculation of new calibration parameters is needed, provide the sensor data suitable for the recalculation of calibration parameters to calibrator 20. In particular, control device 10 may activate calibrator 20 if a calculation of new calibration parameters is necessary. If the calculation of new calibration parameters is finished and/or the calibration parameters presently available are sufficiently accurate, then control device 10 may deactivate calibrator 20, that is, switch it off completely or at least transfer it into a standby mode.

For example, control device 10 may include a storage device 11 in which a set of calibration parameters is stored. This set of calibration parameters may be made available accordingly to compensating device 3. Utilizing the calibration parameters stored in storage device 11, compensating device 3 may thus correct the raw data provided by sensor 2, and make calibrated sensor data available.

Control device 10 also includes a monitoring module 12. This monitoring module 12 monitors the accuracy of the current calibration parameters stored in storage device 11. For example, monitoring module 12 may evaluate the raw data provided by sensor 2, utilizing the calibration parameters stored presently in storage device 11, and check whether the present data provided by sensor 2 supply a result to be expected based on the current calibration parameters. For instance, in the case of a sensor 2 that is not moving, monitoring module 12 may check whether after suitable compensation based on the current calibration parameters, the sensor data of a motion sensor actually also correspond to a standstill. Analogously, sensor data of other sensors such as a yaw-rate sensor, a magnetic-field sensor or the like may be verified, as well. To that end, if applicable, information about the state of sensor 2 may also be made available to monitoring module 12. Monitoring module 12, with the aid of the calibration parameters stored presently in storage device 11, may thus determine whether the compensated sensor data correspond to the sensor data to be anticipated, or whether the corrected sensor data deviate from the values to be expected. Based on the deviation thus determined between the sensor data to be expected and the values determined with the aid of the current calibration parameters, an accuracy value may therefore be calculated.

The accuracy value determined by monitoring module 12 may thereupon be provided to a control module 13. Control module 13 may compare the accuracy value determined by monitoring module 12, to one or more predetermined accuracy criteria. In this manner, control module 13 is able to determine whether the accuracy value presently determined on the basis of the calibration parameters stored in storage device 11 satisfies a preset accuracy criterion, or whether a preset accuracy criterion can no longer be satisfied utilizing calibration parameters stored in storage device 11. If a preset accuracy criterion is unable to be satisfied, then control module 13 may initiate calculation of a new set of calibration parameters by calibrator 20.

In order to calculate a new set of calibration parameters, as a rule, suitable measurement data are necessary from sensor 2. In order to check this, a measurement-data evaluation module 14 may be provided in control device 10. Measurement-data evaluation module 14 is able to receive the measurement data from sensor 2 and check whether these measurement data are suitable for calculating calibration parameters. For example, measurement-data evaluation module 14 may check whether sensor 2 is in a state in which it is able to supply measurement data suitable for calculating a new set of calibration parameters. To that end, for instance, it may be checked whether sensor 2 or the sensor system is at a standstill, whether the alignment of sensor 2 or the sensor system is constant in at least one direction in space and possibly corresponds to a preset alignment, or whether other suitable boundary conditions are satisfied for the provision of measurement data for a calculation of new calibration parameters.

Correspondingly, control module 13 may initiate calculation of a new set of calibration parameters only when, on one hand, by using the calibration parameters stored presently in storage device 11, the accuracy does not satisfy the preset accuracy criterion, and moreover, measurement-data evaluation module 14 has determined that data are provided by sensor 2 which allow calculation of a new set of calibration parameters.

If the conditions indicated above for a new calculation of calibration parameters are satisfied, then control module 13 may activate calibrator 20. Utilizing the measurement data of sensor 2 classified as suitable by measurement-data evaluation module 14, calibrator 20 may thereupon calculate a new set of calibration data. The new calibration parameters calculated by calibrator 20 may then be stored in storage device 11. In so doing, the newly calculated calibration parameters may replace the previously stored calibration data. Alternatively, the newly calculated calibration data may also be stored in addition to the calibration data already stored in storage device 11.

For example, after a set of new calibration parameters has been calculated by calibrator 20, calibrator 20 may be deactivated by control module 13 of control device 10. Calibrator 20 may be completely shut down, for instance. Alternatively, it is also possible to transfer calibrator 20 into a standby mode.

Figure 3:
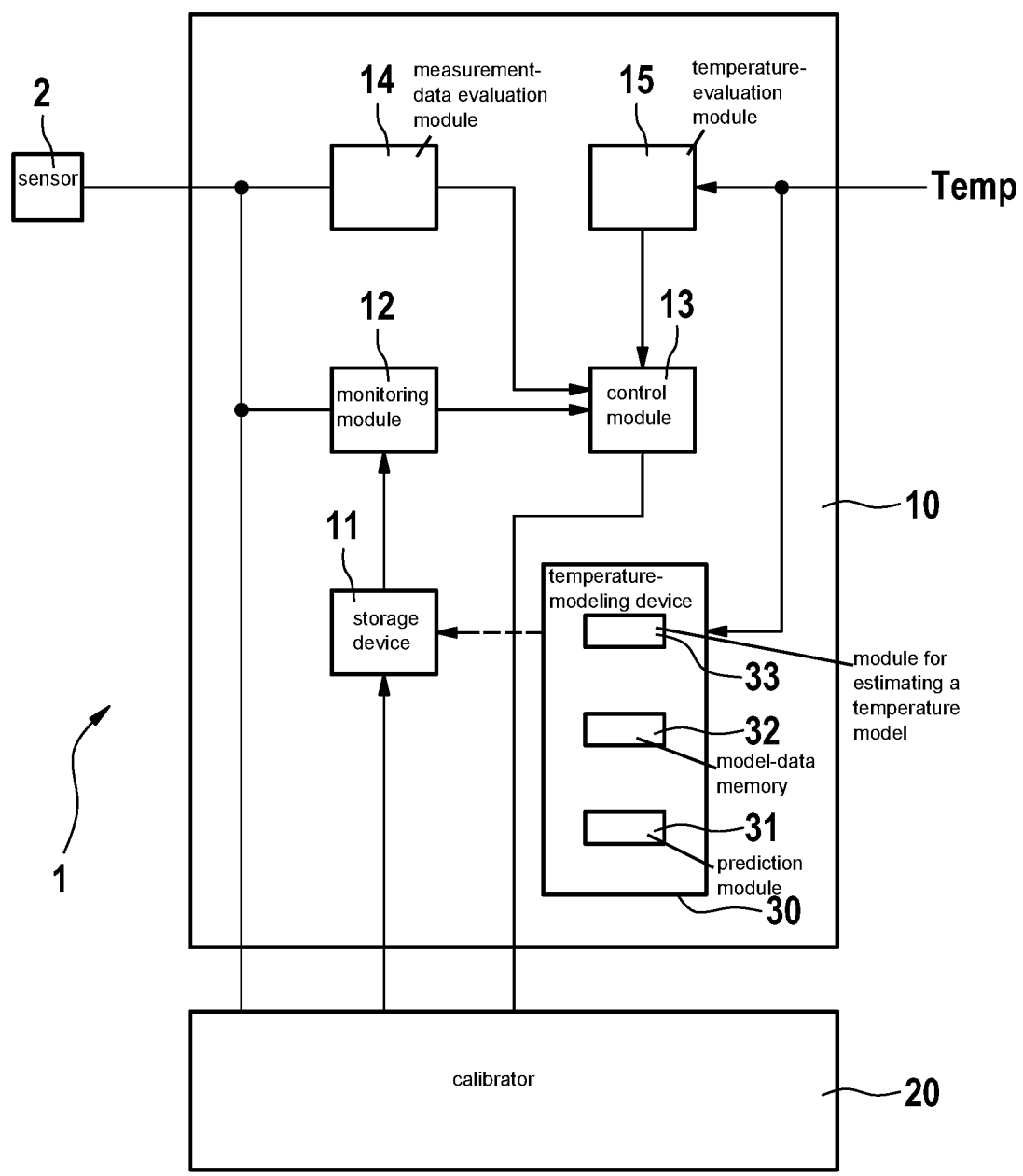
FIG. 3 shows a schematic representation of a block diagram of an apparatus for adjusting calibration parameters according to a further specific embodiment of the present invention.

FIG. 3 shows a schematic representation of a block diagram of an apparatus 1 for adjusting calibration parameters for a sensor 2 according to a further specific embodiment. In this case, apparatus 1 shown in FIG. 3 may include the components described above in connection with FIG. 2. Therefore, the explanations indicated above hold true equally for the specific embodiment according to FIG. 3, as well.

As can be seen in FIG. 3, control device 10 may additionally include a temperature-evaluation module 15. For example, this temperature-evaluation module 15 may receive and evaluate data of a temperature of sensor 2 or of the sensor system having sensor 2. The evaluated temperature data may be received by control module 13 of control device 10. For instance, if it is determined that the temperature at sensor 2 or at the sensor system having sensor 2 has changed significantly, that is, by more than a preset threshold value, then control module 13 may likewise initiate a new calculation of a set of calibration parameters. In particular, control module 13 may initiate a new calculation of calibration parameters when, after detection of a significant temperature change, measurement data are provided by sensor 2 which are suitable for calculating new calibration parameters.

Additionally or alternatively, apparatus 1 for adjusting the calibration parameters may also include a temperature-modeling device 30. For example, this temperature-modeling device 30 may include a model-data memory 32 and a prediction module 31. A module 33 for estimating a temperature model may also be provided in temperature-modeling device 30.

Module 33 for estimating a temperature model may calculate a temperature-dependent model for the calibration parameters, for example. In this way, for instance, a temperature drift of the sensor data may be represented in the form of a mathematical model or the like. In particular, the temperature-dependent model may be calculated on the basis of several sets of calibration parameters which were estimated with the aid of calibrator 20 for different temperatures. The temperature-dependent model of the calibration parameters, or at least the parameterization of such a model may be stored in model-data memory 32, for example. Based on these data stored in model-data memory 32, prediction module 31 may then determine temperature-dependent calibration parameters. In this way, with the aid of these temperature-dependent calibration parameters, the calibration parameters for the correction of the raw sensor data may be adjusted without a new calculation of calibration parameters always becoming necessary in response to every change in temperature. As a result, the expenditure for new calculations of calibration parameters may be further reduced.

Figure 4:
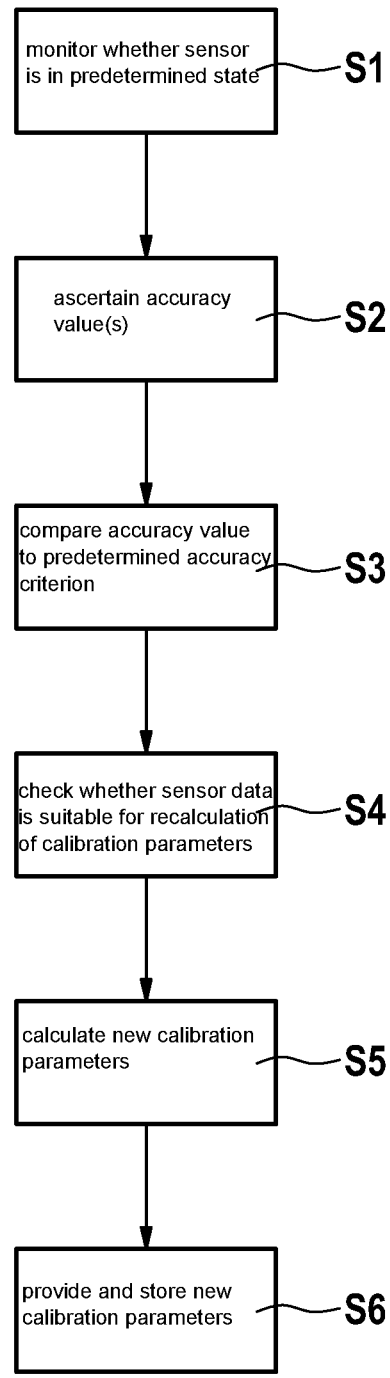
FIG. 4 shows a flowchart as underlies a method for adjusting calibration parameters according to one specific embodiment of the present invention.

FIG. 4 shows a schematic representation of a flowchart as underlies a method for adjusting calibration parameters for a sensor 2 according to one specific embodiment. In principle, the method may include any steps as have already been described for implementing an apparatus 1 described above. Analogously, apparatuses 1 described above for adjusting calibration parameters may also include any suitable components in order to realize the method steps described in the following.

In a step S1, it is first of all monitored whether a sensor 2 is in a predetermined state. For example, depending on sensor 2, it may be monitored whether a motion sensor is at a standstill, or whether a position sensor is in a preset position or has a predetermined alignment at least in one direction in space. In addition, depending on sensor 2, any other suitable states are naturally also possible, which are detected in step S1.

In step S2, at least one accuracy value of a current set of calibration parameters for sensor 2 is then ascertained. For example, it may be ascertained whether in a predetermined state of sensor 2, the raw sensor data compensated on the basis of the calibration parameters deviate from an expected value. In particular, it may be checked whether the corrected raw sensor data deviate from the expected value by more than a preset limit value. Moreover, if applicable, it may also be considered whether at least a preset period of time has already elapsed since a previous calculation of calibration parameters.

In step S3, the ascertained accuracy value is then compared to a predetermined accuracy criterion, e.g., a threshold value for the ascertained accuracy value. If the ascertained accuracy value does not satisfy the predetermined accuracy criterion, then this may make it necessary to recalculate the current set of calibration parameters.

If appropriate, with the aid of an input interface or the like, for example, external signalings for a calculation of a new set of calibration parameters may also be received. Moreover, for a new calculation of a further set of calibration parameters, it is also possible to adjust one or more setting parameters for the calibration process. For example, filter parameters for a filtering, e.g., a temporal filtering or the like, may be adjusted.

In step S4, it may be checked whether the sensor data available from sensor 2 are suitable for a recalculation of calibration parameters. To that end, for example, it may be checked whether sensor 2 is in a state in which it is able to provide sensor data that are suitable for calculating new calibration parameters. To do this, for instance, it may be checked whether a motion sensor is actually at a standstill, or whether a sensor is in a predetermined position or in a predetermined alignment at least in one direction in space. Depending on the type of sensor 2, however, any other criteria are also possible for a check, in order to determine whether a sensor 2 is supplying measured values suitable for a recalculation of calibration parameters.

If the data provided by sensor 2 are suitable for calculating new calibration parameters, and previously in step S3, it has been determined that based on the check of the accuracy of the current calibration parameters and/or further criteria, a new calculation of calibration parameters should be carried out, then in step S5, a set of new calibration parameters may be calculated. The newly calculated calibration parameters may thereupon be provided in step S6 and stored in storage device 11, for example.

Figure 5:
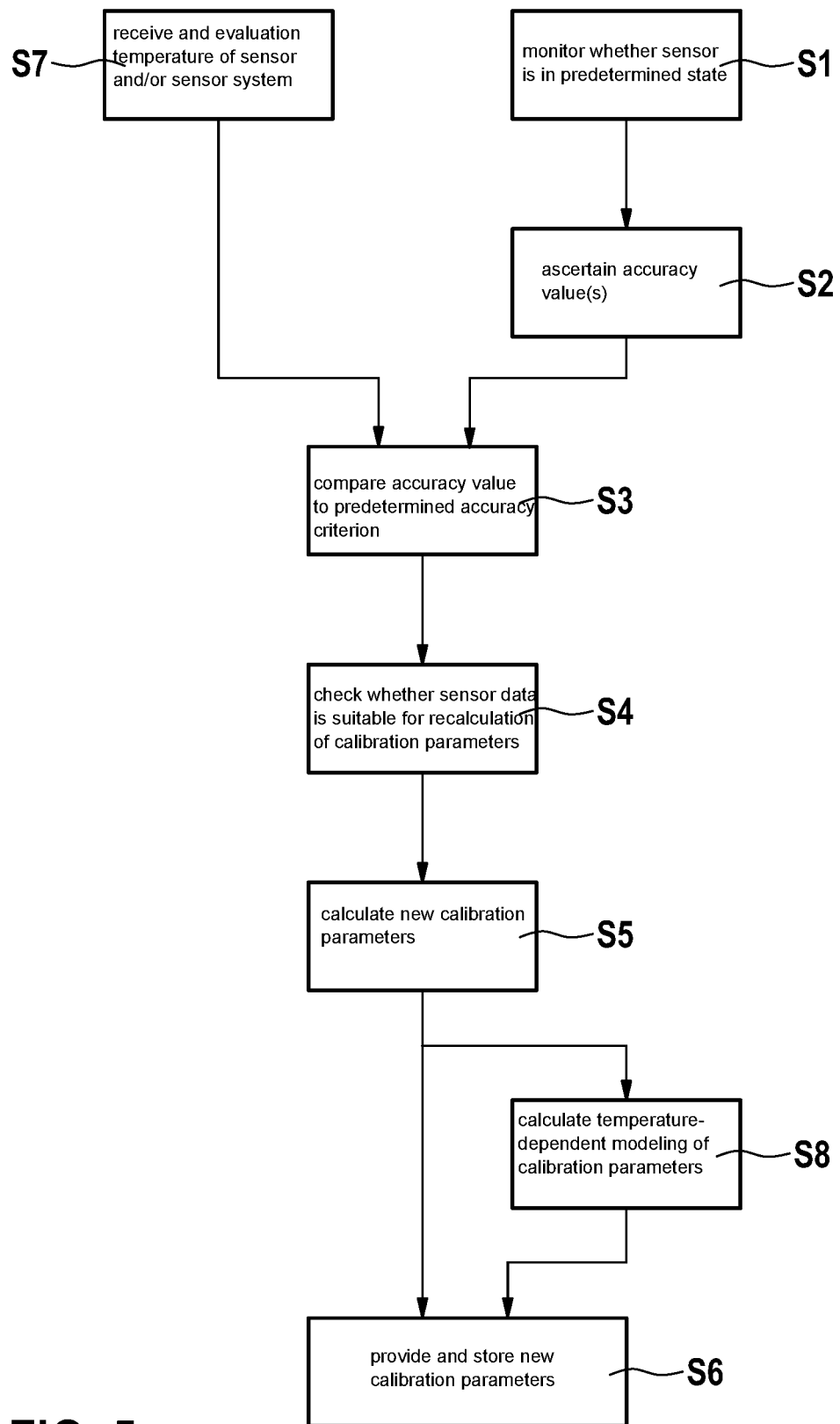
FIG. 5 shows a flowchart as underlies a method for adjusting calibration parameters according to a further specific embodiment of the present invention.

FIG. 5 shows a flowchart as underlies a method for adjusting calibration parameters according to a further specific embodiment. The method in FIG. 5 basically also includes the method steps already described in connection with FIG. 4. Therefore, the explanations already given above pertain for the method according to FIG. 5, as well.

As can be seen in FIG. 5, in addition, the method may include a step S7, for example, in which a temperature of sensor 2 and/or of the sensor system having sensor 2 is received and evaluated. For example, it may be checked whether the temperature of sensor 2 or of the sensor system having sensor 2 changes significantly during operation, that is, by at least a preset threshold value, for instance. In addition, however, any other criteria are also possible for evaluating the sensor temperature. Accordingly, calculation of new calibration parameters may be initiated, for instance, if the temperature of sensor 2 or of the sensor system having sensor 2 has changed according to a preset condition. For example, a new calculation of calibration parameters may be initiated when the temperature of sensor 2 increases or decreases significantly.

In addition, a step S8 may be provided, in which a temperature-dependent modeling of the calibration parameters is implemented. For instance, in step S8, a temperature-dependent modeling of the calibration parameters, especially temperature-dependent changes of the calibration parameters, may be calculated or estimated. Based on such a calculated or estimated modeling for the temperature dependency of the data of sensor 2, the calibration parameters may be adjusted as a function of temperature, for example, without a new calculation of calibration parameters always having to be carried out in response to every change in temperature. To that end, for example, parameters for the modeling of the temperature dependency of the sensor data or the complete temperature-dependent model may be stored in a model-data memory 32. In this way, for example, step S8 may in each case provide temperature-dependent calibration parameters as a function of the temperature of sensor 2 or of the sensor system having sensor 2, without always having to carry out a new calculation of calibration parameters.

For example, if there is only limited storage capacity for the temperature-dependent modeling, then in each case the temperature-dependent modeling may also be limited only to a preset temperature range. If the present temperature of sensor 2 or of the sensor system having sensor 2 deviates from the respective temperature range, then new calibration parameters may be calculated, e.g., with the aid of calibrator 20.

In summary, the present invention relates to the adjusting of calibration parameters for a sensor. The adjusted calibration parameters may be used to correct the raw data of the sensor. In particular, it is provided to calculate new calibration parameters only when accuracy of the calibration parameters currently available is no longer adequate, and measurement data are available for a recalibration of the sensor. Otherwise, the components necessary for calibrating the sensor data may be deactivated in order to reduce energy consumption.

What is claimed is:

1. An apparatus for adjusting calibration parameters for a sensor, comprising:
   a control device; and
   a calibrator;
   wherein the control device includes:
     a storage device configured to store a set of calibration parameters for the sensor,
     a monitoring module configured to ascertain at least one accuracy value of the calibration parameters stored in the storage device, when the sensor is in a predetermined state,
     a control module configured to compare the at least one ascertained accuracy value of the calibration parameters to a predetermined accuracy criterion, and
     a measurement-data evaluation module configured to receive measurement data from the sensor and to check whether the measurement data received are configured for calculating calibration parameters; and
   wherein the calibrator is configured to calculate a new set of calibration parameters utilizing the measurement data received, based on the at least one ascertained accuracy value of the calibration parameters stored in the storage device not satisfying the accuracy criterion, and the measurement data received being configured for determining the new set of calibration parameters,
   wherein the control device is configured to modify setting parameters of the calibrator which influence the weighting of the measured values.

2. The apparatus as recited in claim 1, wherein the control device is configured to activate the calibrator when the at least one ascertained accuracy value of the calibration parameters stored in the storage device does not satisfy the accuracy criterion, and the measurement data received are configured for determining a new set of calibration parameters.

3. The apparatus as recited in claim 2, wherein the control device is configured to deactivate the calibrator after the calibrator has finished calculating the new set of calibration parameters.

4. The apparatus as recited in claim 2 wherein the control device is configured to activate the calibrator when a predetermined period of time has elapsed since the last calculation of the new set of calibration parameters.

5. The apparatus as recited in claim 1, wherein the parameters include filter parameters.

6. The apparatus as recited in claim 1, wherein the control device includes a temperature-evaluation module, which is configured to ascertain a present temperature of the sensor, and the control device is configured to activate the calibrator when the ascertained present temperature of the sensor deviates from a preset reference temperature value by more than a predetermined threshold value.

7. The apparatus as recited in claim 1, further comprising:
   a temperature-modeling device which includes a model-data memory and a prediction module, the prediction module being configured to provide temperature-dependent calibration parameters, utilizing a present temperature and a temperature model stored in the model-data memory.

8. The apparatus as recited in claim 7, wherein the temperature-modeling device includes a module configured to estimate the temperature model, which is configured to calculate a temperature-dependent model for the calibration parameters, and to store data of the calculated temperature model in the model-data memory of the temperature-modeling device.

9. The apparatus as recited in claim 1, wherein the measurement-data evaluation module is configured to classify the measurement data as configured for a calculation of calibration parameters, when the sensor is in a predetermined state.

10. The apparatus as recited in claim 9, wherein the measurement-data evaluation module is configured to classify only those measurement data as configured for the calculation of calibration parameters, which differ sufficiently from measurement data taken as a basis for a previous calculation of calibration parameters.

11. The apparatus as recited in claim 1, further comprising:
an input interface via which the control device and/or the calibrator is selectively activated and deactivated totally or in part.

12. A sensor system, comprising:
a sensor configured to output measurement data that correspond to a measured variable monitored by the sensor;
an apparatus for adjusting calibration parameters for the sensor, including:
a control device; and
a calibrator;
wherein the control device includes:
a storage device configured to store a set of calibration parameters for the sensor,
a monitoring module configured to ascertain at least one accuracy value of the calibration parameters stored in the storage device, when the sensor is in a predetermined state,
a control module configured to compare the at least one ascertained accuracy value of the calibration parameters to a predetermined accuracy criterion, and
a measurement-data evaluation module configured to receive the measurement data from the sensor and to check whether the measurement data received are configured for calculating calibration parameters; and
wherein the calibrator is configured to calculate a new set of calibration parameters utilizing the measurement data received, based on the at least one ascertained accuracy value of the calibration parameters stored in the storage device not satisfying the accuracy criterion, and the measurement data received being configured for determining the new set of calibration parameters; and
a compensating device configured to correct the measurement data output by the sensor utilizing calibration parameters,
wherein the control device is configured to modify setting parameters of the calibrator which influence the weighting of the measured values.

13. The sensor system as recited in claim 12, wherein the sensor includes at least one micro-electro-mechanical sensor.

14. The sensor system as recited in claim 13, wherein the micro-electro-mechanical sensor including an acceleration sensor, and/or a yaw-rate sensor, and/or a magnetic sensor.

15. A method for adjusting calibration parameters for a sensor, the method comprising the following steps:
monitoring whether the sensor is in a predetermined state;
ascertaining at least one accuracy value of a current set of calibration parameters for the sensor;
comparing the at least one ascertained accuracy value of the current set of calibration parameters to a predetermined accuracy criterion;
checking whether the measurement data provided by the sensor are configured for calculating calibration parameters; and
calculating a new set of calibration parameters utilizing the measurement data received, based on the at least one ascertained accuracy value of the current set of calibration parameters not satisfying the predetermined accuracy criterion, and the measurement data received being configured for calculating a new set of calibration parameters,
wherein the control device is configured to modify setting parameters of the calibrator which influence the weighting of the measured values.

* * * * *